(12) United States Patent
Park

(10) Patent No.: US 8,488,392 B2
(45) Date of Patent: Jul. 16, 2013

(54) SEMICONDUCTOR MEMORY DEVICE AND METHOD OF OPERATING THE SAME

(75) Inventor: Won Sun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 74 days.

(21) Appl. No.: 13/178,643

(22) Filed: Jul. 8, 2011

(65) Prior Publication Data
US 2012/0008425 A1 Jan. 12, 2012

(30) Foreign Application Priority Data
Jul. 9, 2010 (KR) ........................ 10-2010-0066501

(51) Int. Cl.
G11C 7/10 (2006.01)
(52) U.S. Cl.
USPC ............ 365/189.05; 365/189.04; 365/230.08; 365/233.1

(58) Field of Classification Search
USPC ................ 365/189.05, 189.04, 230.08, 233.1
See application file for complete search history.

(56) References Cited

U.S. PATENT DOCUMENTS

| | | | |
|---|---|---|---|
| 5,528,552 A * | 6/1996 | Kamisaki | 365/238.5 |
| 6,456,517 B2 * | 9/2002 | Kim et al. | 365/51 |
| 8,255,643 B2 * | 8/2012 | Mun | 711/154 |
| 2009/0257280 A1 * | 10/2009 | Oh et al. | 365/185.19 |
| 2010/0229007 A1 * | 9/2010 | Park | 713/193 |
| 2010/0259983 A1 * | 10/2010 | Yoon | 365/185.12 |

* cited by examiner

Primary Examiner — Pho M Luu
(74) Attorney, Agent, or Firm — IP & T Group LLP

(57) ABSTRACT

A semiconductor memory device includes a memory cell array including a plurality of memory cells, circuits configured to receive program data when a program operation is performed and output a random signal in response to the program data, and a page buffer configured to logically combine the program data and the random signal and to store the logically combined data in the memory cells.

18 Claims, 2 Drawing Sheets

SEMICONDUCTOR MEMORY DEVICE AND METHOD OF OPERATING THE SAME

CROSS-REFERENCE TO RELATED APPLICATION

Priority to Korean patent application number 10-2010-0066501 filed on Jul. 9, 2010, the entire disclosure of which is incorporated by reference herein, is claimed.

BACKGROUND

Exemplary embodiments relate to a semiconductor memory device and a method of operating the same and, more particularly, to a semiconductor memory device for randomizing and programming external input data and a method of operating the same.

A semiconductor memory device includes an I/O circuit for receiving program data from a host and externally outputting data stored in the semiconductor memory device, a column selection circuit for sequentially inputting the program data of the I/O circuit to a page buffer, and the page buffer for controlling the potential of a bit line when a program operation is performed in response to the program data received from the column selection circuit.

In a program operation of a semiconductor memory device, when certain bits of data are stored in memory cells of a memory cell array, interference may occur between the data, thereby degrading reliability of the program operation. More particularly, if the same data is intensively stored in some memory cells of the memory cell array, a potential difference may be internally generated in the memory cell array including the plurality of memory cells and thus the data stored in the memory cells may be changed. In order to prevent this phenomenon, the program data received from the host is randomized and programmed into the memory cell array.

To this end, after an operation of randomizing program data inputted to the I/O circuit is performed, the randomized data is sent to the column selection circuit, and the column selection circuit inputs received data to the page buffer. If a program operation using the randomized data is performed, the program data received from the host is not sequentially programmed into the memory cell array, but randomly programmed into the memory cell array. A read operation may read the data randomized and programmed in the program operation in reverse order.

When program data has not been inputted into a column of the memory cell array, an initial value of the page buffer should be outputted in the read operation. However, incorrect data may be outputted as read data due to the randomization operation. In order to prevent this phenomenon, the program data from the host should be inputted to all columns of the memory cell array.

BRIEF SUMMARY

According to exemplary embodiments, reliability of the entire data randomization process can be improved by additionally generating random data for a column that is not designated by a host using the latch of a page buffer.

A semiconductor memory device according to an aspect of this disclosure includes a memory cell array including a plurality of memory cells; circuits configured to receive program data when a program operation is performed and output a random signal in response to the program data; and a page buffer configured to logically combine the program data and the random signal and to store the logically combined data in the memory cells.

The circuits may include an I/O circuit and a column selection circuit for receiving the program data and transferring the program data to the page buffer; a random signal generator circuit for generating the random signal; and a control circuit for generating control signals to enable the page buffer to perform the logical combination.

The page buffer may include a plurality of latches for storing the program data, data corresponding to the random signal, and the combined data.

The random signal generation circuit may include a plurality of random signal generators each including a random circuit for generating and storing the random signal in response to the program data and a random switch for transferring the program data and the random signal to the page buffer in response to a random enable signal.

According to another aspect of this disclosure, there is provide a method of operating a semiconductor memory device, including a random circuit configured to generate a random signal and a page buffer including a plurality of latches coupled between a sense node and a common node. The method includes inputting program data to first latch of the latched; storing the program data of the first latch in a second latch of the latches and storing inverse data of the program data of the first latch in a third latch of the latches; storing an inverse signal of the random signal in the first latch; and storing data, obtained by performing a logic operation on the program data and the random signal, in the third latch.

In order to store the data, obtained by performing the logic operation on the program data and the random signal, in the third latch, the sense node is precharged, a potential of the sense node is changed based on data stored in the first latch, data stored in the third latch is determined based on the potential of the sense node, the sense node is precharged, the potential of the sense node is changed based on data stored in the first and second latches, and the data stored in the third latch is determined based on the potential of the sense node.

The random signal is generated to have a logic value randomly selected from among logic values '0' and '1' whenever the program data are inputted.

When the sense node is precharged and the potential of the sense node is changed based on the data stored in the first and second latches, if data '1' is stored in both the first and second latches, the potential of the sense node is maintained, and if data '0' is stored in at least one of the first and second latches, the potential of the sense node is changed to a logic value corresponding to data '0'.

DESCRIPTION OF EMBODIMENTS

Hereinafter, some exemplary embodiments of the present disclosure will be described in detail with reference to the accompanying drawings. The figures are provided to enable those of ordinary skill in the art to make and use the exemplary embodiments of the disclosure.

Figure 1:
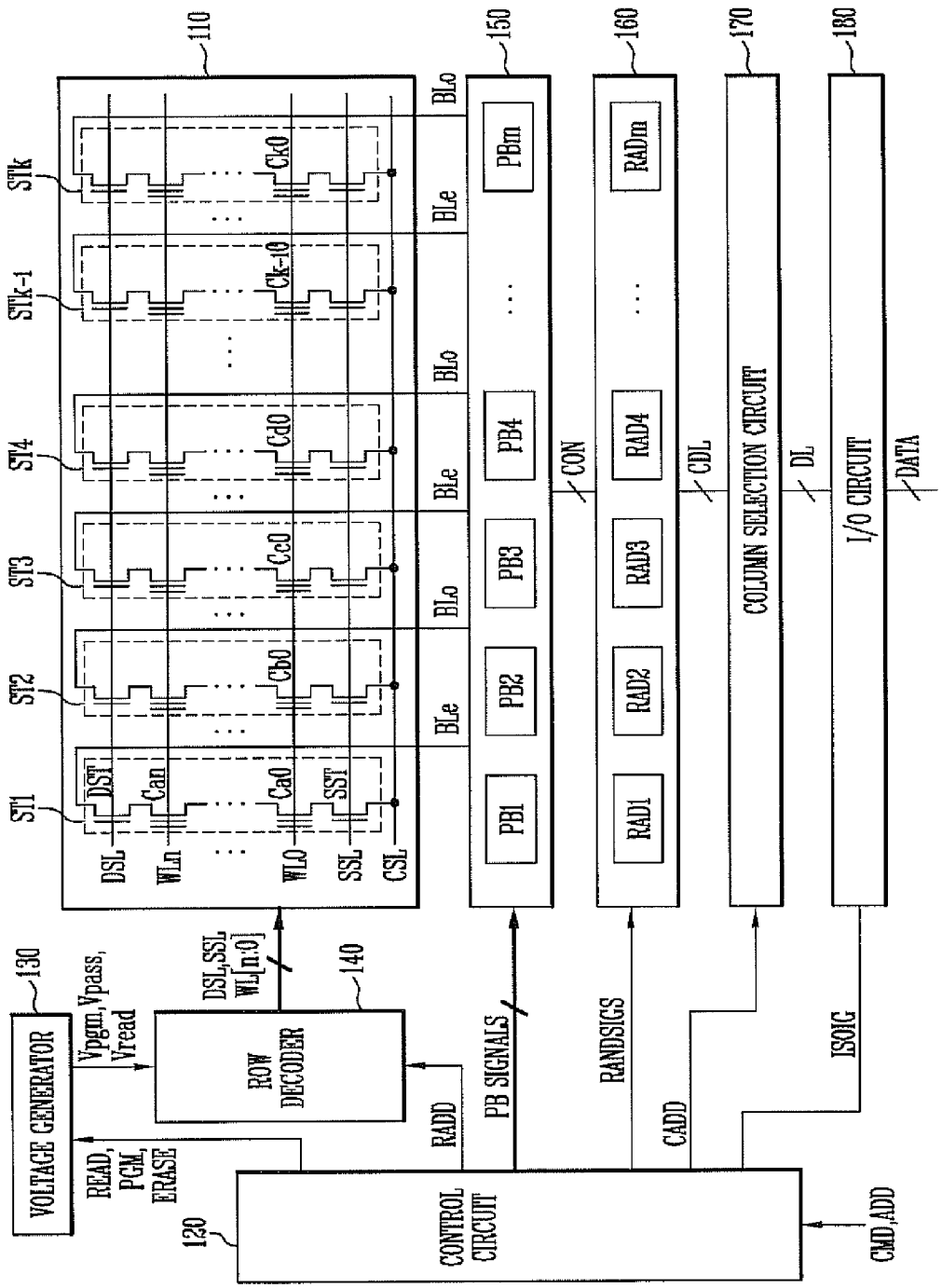
FIG. 1 is a block diagram showing a semiconductor memory device according to an exemplary embodiment of this disclosure.

FIG. 1 is a block diagram showing a semiconductor memory device according to an exemplary embodiment of this disclosure.

The semiconductor memory device according to an exemplary embodiment of this disclosure includes a memory cell array 110, an operation circuit group (130, 140, 150, 160, 170, and 180) for performing a program operation or a read operation on the memory cells of the memory cell array 110, and a control circuit 120 for controlling the operation circuit group (130, 140, 150, 160, 170, and 180) so that data received from a host is randomized and stored in the memory cell array 110 when a program operation is performed.

Herein, the semiconductor memory device may be a NAND flash memory device. Further, the operation circuit group may include a voltage generator 130, a row decoder 140, a page buffer circuit 150, a random signal generation circuit 160, a column selection circuit 170, and an I/O circuit 180.

The memory cell array 110 may include a plurality of memory blocks. For convenience, FIG. 1 shows only one of the memory blocks. The memory block includes a plurality of strings ST0 to STk. Each of the strings ST1 to STk includes a source select transistor SST coupled to a common source line CSL, a plurality of memory cells Ca0 to Can, and a drain select transistor DST coupled to a bit line BLe or BLo. The gate of the source select transistor SST is coupled to a source select line SSL, and the gates of the memory cells Ca0 to Can are coupled to respective word lines WL0 to WLn. The gate of the drain select transistor DST is coupled to a drain select line DSL. The strings ST1 to STk are coupled to respective bit lines BLe and BLo and are commonly coupled to the common source line CSL.

The control circuit 120 internally generates a program operation signal PGM, a read operation signal READ, or an erase operation signal ERASE in response to a command signal CMD. The control circuit 120 generates control signals PB SIGNALS for controlling page buffers PB1 to PBm of the page buffer circuit 150 according to the type of the operation and data random signals RANDSIGS for controlling the data randomization operation of the random signal generation circuit 160. Furthermore, the control circuit 120 internally generates a row address signal RADD and a column address signal CADD in response to an address signal ADD.

A voltage supply circuit (130, 140) supplies operating voltages for the program operation, the erase operation, or the read operation of memory cells to the drain select line DSL, the word lines WL0 to WLn, and the source select line SSL of a selected memory block in response to the signals READ, PGM, ERASE, and RADD of the control circuit 120. The voltage supply circuit includes the voltage generator 130 and the row decoder 140.

The voltage generator 130 outputs the operating voltages for programming, reading, or erasing memory cells to global lines in response to the internal command signals of the control circuit 120 (that is, the operation signals PGM, READ, and ERASE). When memory cells are programmed, the voltage generator 130 outputs the operating voltages for the program operation (for example, Vpgm, Vpass, and Vread) to the global lines.

The row decoder 140 transfers the operating voltages of the voltage generator 130 to the strings ST1 to STk of a memory block, selected from among the memory blocks of the memory cell array 110, in response to the row address signals RADD of the control circuit 120. In other words, the operating voltages are supplied to the local lines DSL, WL[0:n], and SSL of the selected memory block.

The page buffer circuit 150 includes page buffers PB1 to PBm coupled to the respective bit lines BLe and BLo. The page buffer circuit 150 supplies voltage, used to store data in the memory cells Ca0 to Ck0, to each of the bit lines BLe and BLo in response to the control signals PB SIGNALS of the control circuit 120. More particularly, when the program operation, the erase operation, or the read operation of the memory cells Ca0 to Ck0 is performed, the page buffer circuit 150 precharges the bit lines BLe and BLo or latches data corresponding to a threshold voltage level of the memory cells Ca0 to Ck0 which is detected based on a shift in voltage of the bit lines BLe and BLo. That is, the page buffer circuit 150 controls voltage of the bit line BLe or BLo in response to data stored in the memory cells Ca0 to Ck0 and detects the data stored in the memory cells Ca0 to Ck0. Furthermore, the page buffer circuit 150 stores randomized data in respective latches in a random mode.

In a normal mode, the random signal generation circuit 160 transfers program data, received from the column selection circuit 170, to the page buffer circuit 150 as it is. In a random mode, the random signal generation circuit 160 randomizes the program data by randomly outputting a signal of '0' or '1' in response to the random signals RANDSIGS of the control circuit 120. To this end, the random signal generation circuit 160 includes a plurality of random signal generators RAD1 to RADm.

The column selection circuit 170 selects the page buffers of the page buffer circuit 150 in response to the column address signal CADD of the control circuit 120 and outputs data latched in a page buffer selected by the column selection circuit 170.

The I/O circuit 180 transfers data, externally received when a program operation is performed, to the column selection circuit 170 under the control of the control circuit 120 so that the received data is inputted to the page buffer circuit 150. When the data of the column selection circuit 170 is sequentially inputted to the page buffers of the page buffer circuit 150, the page buffers store the inputted data in their internal latches. Furthermore, when a read operation is performed, the I/O circuit 180 externally outputs data received from the page buffers of the page buffer circuit 150 via the column selection circuit 170.

Figure 2:
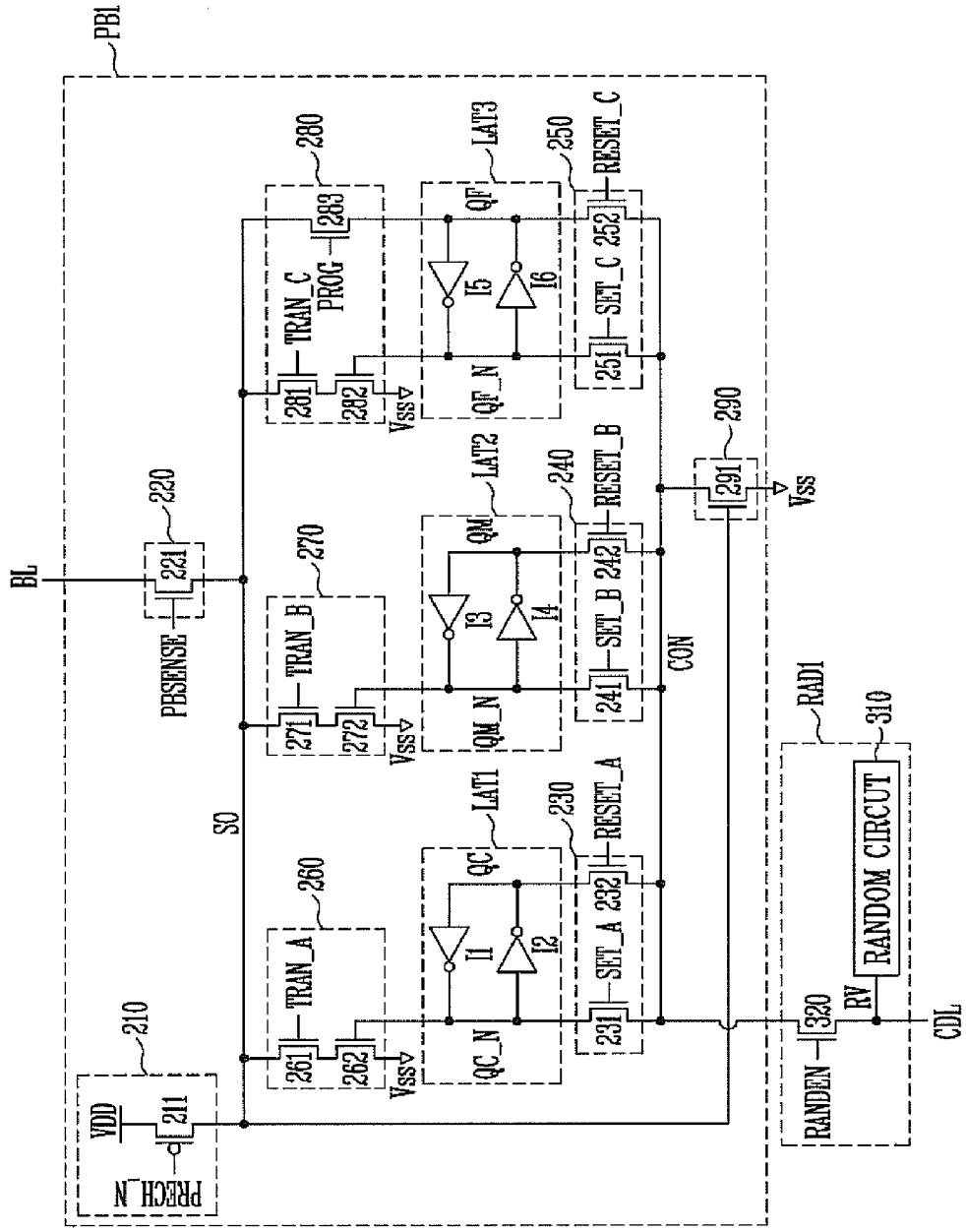
FIG. 2 is a circuit diagram of a page buffer and a random signal generator according to an exemplary embodiment of this disclosure.

FIG. 2 is a circuit diagram of a page buffer and a random signal generator according to an exemplary embodiment of this disclosure. The page buffers PB1 to PBm may have the same construction as the page buffer shown in FIG. 2. Likewise, the random signal generators RAD1 to RADm may also have the same construction as the random signal generator shown in FIG. 2. One page buffer and one random signal generator form a pair. As an example, the first page buffer PB1 and the first random signal generator RAD1 are described in detail in FIG. 2.

The first page buffer PB1 includes a precharge circuit 210, a sense circuit 220, first to third latches LAT1, LAT2, and LAT3, first to third set/reset circuits 230, 240, and 250, and first to third transmission circuits 260, 270, and 280.

The precharge circuit 210 functions to precharge a sense node SO by coupling a power supply voltage terminal VDD and the sense node SO in response to a precharge signal PRECH_N. To this end, the precharge circuit 210 is implemented using a PMOS transistor 211. The PMOS transistor 211 is coupled between the power supply voltage terminal VDD and the sense node SO and operates in response to the precharge signal PRECH_N.

The sense circuit 220 couples a selected bit line BL and the sense node SO in response to a sense signal PBSENSE. To this end, the sense circuit 220 is implemented using an NMOS transistor 221. The NMOS transistor 221 is coupled between the bit line BL and the sense node SO and operates in response to the sense signal PBSENSE.

The first latch LAT1 includes first and second inverters I1 and I2. The input terminal of the first inverter I1 and the output terminal of the second inverter I2 are coupled together, and the output terminal of the first inverter I1 and the input terminal of the second inverter I2 are coupled together, The input terminal of the first inverter I1 is called a cache node QC, and the output terminal of the first inverter I1 is called an inverse cache node QC_N.

The second latch LAT2 includes third and fourth inverters I3 and I4. The input terminal of the third inverter I3 and the output terminal of the fourth inverter I4 are coupled together, and the output terminal of the third inverter I3 and the input terminal of the fourth inverter I4 are coupled together. The input terminal of the third inverter I3 is called a main node QM, and the output terminal of the third inverter I3 is called an inverse main node QM_N.

The third latch LAT3 includes fifth and sixth inverters I5 and I6. The input terminal of the fifth inverter I5 and the output terminal of the sixth inverter I6 are coupled together, and the output terminal of the fifth inverter I5 and the input terminal of the sixth inverter I6 are coupled together. The input terminal of the fifth inverter I5 is called a flag node QF, and the output terminal of the fifth inverter I5 is called an inverse flag node QF_N.

The first set/reset circuit 230 sends data, inputted to the first latch LAT1, to a common node CON in response to a first set signal SET_A and a first reset signal RESET_A. The first set/reset circuit 230 includes an NMOS transistor 231 and an NMOS transistor 232. The NMOS transistor 231 operates in response to the first set signal SET_A and is configured to couple the inverse cache node QC_N and the common node CON. The NMOS transistor 232 operates in response to the first reset signal RESET_A and is configured to couple the cache node QC and the common node CON.

The second set/reset circuit 240 sends data, inputted to the second latch LAT2, to the common node CON in response to a second set signal SET_B and a second reset signal RESET_B. The second set/reset circuit 240 includes an NMOS transistor 241 and an NMOS transistor 242. The NMOS transistor 241 operates in response to the second set signal SET_B and is configured to couple the inverse main node QM_N and the common node CON. The NMOS transistor 242 operates in response to the second reset signal RESET_B and is configured to couple the main node QM and the common node CON.

The third set/reset circuit 250 sends data, inputted to the third latch LAT3, to the common node CON in response to a third set signal SET_C and a third reset signal RESET_C. The third set/reset circuit 250 includes an NMOS transistor 251 and an NMOS transistor 252. The NMOS transistor 251 operates in response to the third set signal SET_C and is configured to couple the inverse flag node QF_N and the common node CON. The NMOS transistor 252 operates in response to the third reset signal RESET_C and is configured to couple the flag node QF and the common node CON.

The first transmission circuit 260 functions to maintain the potential of the sense node SO or discharge the sense node SO in response to data stored in the first latch LAT1. The first transmission circuit 260 includes a first switch 261 and a second switch 262 coupled in series between the sense node SO and a ground terminal Vss. The first switch 261 is implemented using an NMOS transistor operating in response to a first transmission signal TRAN_A and configured to couple the sense node SO and the second switch 262. The second switch 262 is implemented using an NMOS transistor operating in response to data inputted to the inverse cache node QC_N and configured to couple the first switch 261 and the ground terminal Vss.

The second transmission circuit 270 functions to maintain the potential of the sense node SO or discharge the sense node SO in response to data stored in the second latch LAT2. The second transmission circuit 270 includes a third switch 271 and a fourth switch 272 coupled in series between the sense node SO and the ground terminal Vss. The third switch 271 is implemented using an NMOS transistor operating in response to a second transmission signal TRAN_B and configured to couple the sense node SO and the fourth switch 272. The fourth switch 272 is implemented using an NMOS transistor operating in response to data inputted to the inverse main node QM_N and configured to couple the third switch 271 and the ground terminal Vss.

The third transmission circuit 280 functions to maintain the potential of the sense node SO or discharge the sense node SO in response to data stored in the third latch LAT3. The third transmission circuit 280 includes a fifth switch 281 and a sixth switch 282, coupled in series between the sense node SO and the ground terminal Vss, and a seventh switch 283 coupled between the sense node SO and the third latch LAT3. The fifth switch 281 is implemented using an NMOS transistor operating in response to a third transmission signal TRAN_C and configured to couple the sense node SO and the sixth switch 282. The sixth switch 282 is implemented using an NMOS transistor operating in response to data inputted to the inverse flag node QF_N and configured to couple the fifth switch 281 and the ground terminal Vss. The seventh switch 283 is implemented using an NMOS transistor operating in response to a fourth transmission signal PROG and configured to couple the sense node SO and the flag node QF.

A discharge circuit 290 functions to discharge the common node CON in response to a potential of the sense node SO. The discharge circuit 290 includes an NMOS transistor 291 operating in response to a potential of the sense node SO and coupled between the common node CON and the ground terminal Vss.

The first random signal generator RAD1 is coupled between a column data line CDL and the common node CON of the first page buffer PB1 and is configured to output a random signal RV to the common node CON in the random mode. The first random signal generator RAD1 includes a random switch 320 and a random circuit 310. The random switch 320 transfers program data, received through the column data line CDL, to the first latch LAT1 when a program operation of a random mode is performed.

The random circuit 310 randomly outputs the random signal RV of '0' or '1'. The random switch 320 is implemented using an NMOS transistor.

A program operation using the above described circuits in the random mode is described below.

When program data is inputted to the I/O circuit 180, the I/O circuit 180 sends the program data to the column selection circuit 170. The column selection circuit 170 sends the received program data to the respective page buffers PB1 to PBm. The program data sent to the page buffers PB1 to PBm is also stored in the random signal generators RAD1 to RADm.

TABLE 1

| | Program data | RV | Cache node (1st latch) | Main node (2nd latch) | Flag node (3rd latch) |
|---|---|---|---|---|---|
| Case 1 | 0 | — | 0 | — | — |
| Case 2 | 1 | — | 1 | — | — |

Referring to Table 1, if program data '0' is inputted (case 1), a random enable signal RANDEN and the first reset signal RESET_A are activated, and so data '0' is stored in the cache node QC. If the program data '1' is inputted (case 2), the random enable signal RANDEN and the first reset signal RESET_A are activated, and so data '1' is stored in the cache node QC. Here, when the data is '0', a potential of the corresponding node may be a voltage 'Vcc'. Also, when the data is '1', a potential of the corresponding node may be '0 V'.

TABLE 2

| | Program data | RV | Cache node (1st latch) | Main node (2nd latch) | Flag node (3rd latch) |
|---|---|---|---|---|---|
| Case 1 | 0 | — | 0 | 0 | 1 |
| Case 2 | 1 | — | 1 | 1 | 0 |

When a program check command 10h is received from a host, a program operation starts. When the program operation starts, the first reset signal RESET_A, the second reset signal RESET_B, and the third set signal SET_C are activated. Thus, data stored in the first latch LAT1 is stored in the second latch LAT2, and inverse data of the data stored in the first latch LAT1 is stored in the third latch LAT3. Referring to Table 2, if program data is '0' (case 1), data '0' is stored in the cache node QC and the main node QM, and data '1' is stored in the flag node QF. If the program data is '1' (case 2), data '1' is stored in the cache node QC and the main node QM, and data '0' is stored in the flag node QF.

TABLE 3

| | Program data | RV | Cache node (1st latch) | Main node (2nd latch) | Flag node (3rd latch) |
|---|---|---|---|---|---|
| Case 1 | 0 | 0 | 1 | 0 | 1 |
|  |  | 1 | 0 | 0 | 1 |
| Case 2 | 1 | 0 | 1 | 1 | 0 |
|  |  | 1 | 0 | 1 | 0 |

Referring to Table 3, the random circuit 310 outputs the random signal RV of '0' or '1'. When the random signal RV is outputted, the random circuit 310 stores the random signal RV. The stored random signal RV is used in a subsequent read operation. The random enable signal RANDEN and the first set signal SET_A are activated, and thus an inverse signal of the random signal RV is stored in the cache node QC. When program data is '0' and the random signal RV is '0', data '1' is stored in the cache node QC. When the program data is '0' and the random signal RV is '1', data '0' is stored in the cache node QC. When the program data is '1' and the random signal RV is '0', data '1' is stored in the cache node QC. When the program data is '1' and the random signal RV is '1', data '0' is stored in the cache node QC. At this time, data stored in the main node QM and the flag node QF is not changed.

TABLE 4

| | Program data | RV | Cache node (1st latch) | Main node (2nd latch) | Flag node (3rd latch) | Sense node |
|---|---|---|---|---|---|---|
| Case 1 | 0 | 0 | 1 | 0 | 1 | 1 |
|  |  | 1 | 0 | 0 | 1 | 0 |
| Case 2 | 1 | 0 | 1 | 1 | 0 | 1 |
|  |  | 1 | 0 | 1 | 0 | 0 |

Referring to Table 4, after the sense node SO is precharged by activating the precharge signal PRECH_N, the precharge signal PRECH_N is deactivated. When the sense node SO is precharged, the discharge circuit 290 is activated, and thus the common node SO is discharged. Data '1' is stored in the sense node SO as it is precharged. Here, data of the sense node SO is changed in response to data stored in the first latch LAT1 by activating the first transmission signal TRAN_A. That is, when data stored in the cache node QC of the first latch LAT1 is '1', the second switch 262 is turned off. Accordingly, the data '1' stored in the sense node SO remains intact even if the first transmission signal TRAN_A is activated. On the other hand, when data stored in the cache node QC of the first latch LAT1 is '0', the second switch 262 is turned on. Accordingly, the data of the sense node SO is changed from '1' to '0' when the first transmission signal TRAN_A is activated.

TABLE 5

| | Program data | RV | Cache node (1st latch) | Main node (2nd latch) | Flag node (3rd latch) | Sense node |
|---|---|---|---|---|---|---|
| Case 1 | 0 | 0 | 1 | 0 | 0 | 1 |
|  |  | 1 | 0 | 0 | 1 | 0 |
| Case 2 | 1 | 0 | 1 | 1 | 0 | 1 |
|  |  | 1 | 0 | 1 | 0 | 0 |

Referring to Table 5, data stored in the third latch LAT3 is maintained or changed in response to data of the sense node SO by activating the third reset signal RESET_C. That is, when program data is '0' and data stored in the cache node QC is '1', data '1' is stored in the sense node SO as described in Table 4, and thus the common node CON is discharged. When the third reset signal RESET_C is activated, the discharged common node CON and the flag node QF are coupled together, and data stored in the flag node QF is changed from '1' to '0'. When the program data is '0' and data stored in the cache node QC is '0', data '0' is stored in the sense node SO as described in Table 4. Accordingly, although the third reset signal RESET_C is activated, the previous data '1' is maintained in the flag node QF. Furthermore, when the program data is '1' and data stored in the cache node QC is '1', data '1' is stored in the sense node SO. When the third reset signal RESET_C is activated, data '0' is stored in the flag node QF. When the program data is '1' and data stored in the cache node QC is '0', data '0' is stored in the sense node SO. Accordingly, although the third reset signal RESET_C is activated, the previous data '0' is maintained in the flag node QF.

TABLE 6

| | Program data | RV | Cache node (1st latch) | Main node (2nd latch) | Flag node (3rd latch) | Sense node |
|---|---|---|---|---|---|---|
| Case 1 | 0 | 0 | 1 | 0 | 0 | 0 |
|  |  | 1 | 0 | 0 | 1 | 0 |
| Case 2 | 1 | 0 | 1 | 1 | 0 | 1 |
|  |  | 1 | 0 | 1 | 0 | 0 |

Referring to Table 6, after the sense node SO is precharged by activating the precharge signal PRECH_N, the precharge signal PRECH_N is deactivated, and the first transmission signal TRAN_A and the second transmission signal TRAN_B are activated. Accordingly, if at least one of data stored in the cache node QC and the main node QM is '0', the sense node SO is discharged, and thus data '0' is stored in the sense node SO. Furthermore, if data '1' is stored in both the cache node QC and main node QM, the previous data is maintained in the sense node SO.

TABLE 7

|  | Program data | RV | Cache node (1st latch) | Main node (2nd latch) | Flag node (3rd latch) | Sense node |
|---|---|---|---|---|---|---|
| Case 1 | 0 | 0 | 1 | 0 | 0 | 0 |
|  |  | 1 | 0 | 0 | 1 | 0 |
| Case 2 | 1 | 0 | 1 | 1 | 1 | 1 |
|  |  | 1 | 0 | 1 | 0 | 0 |

Referring to Table 7, data stored in the third latch LAT3 is maintained or changed in response to data stored in the sense node SO by activating the third set signal SET_C. If data '0' is stored in the sense node SO, the discharge circuit 290 is deactivated, and thus data stored in the third latch LAT3 remains intact. If data '1' is stored in the sense node SO, the discharge circuit 290 is activated, and thus the common node CON is discharged. Accordingly, when the third set signal SET_C is activated, data '1' is stored in the third latch LAT3.

A program operation is performed based on data stored in the third latch LAT3 through the above random operation.

In particular, it can be seen that as a result of the operations from Table 1 to Table 7, data obtained by performing an XOR operation on the random signal RV and program data received from a host are stored in the third latch LAT3. A program operation is performed using data obtained by performing an XOR operation.

Furthermore, data randomized and programmed by the above operation method can be read by reading programmed data of the memory cells using the second latch LAT2, storing an inverse value of the read data in the third latch LAT3, and then supplying the inverse random signal to the first latch LAT1.

According to this disclosure, in an operation of randomizing and programming data, data randomization is also performed on a column, which is not designated by a host, by generating data in all the latches of a page buffer. Accordingly, the generation of incorrect data can be prevented.

What is claimed is:

1. A semiconductor memory device, comprising:
a memory cell array comprising a plurality of memory cells;
a random signal generator circuit configured to generate a random signal; and
a page buffer configured to logically combine program data and the random signal and to store the logically combined data which is programmed to the memory cells.

2. The semiconductor memory device of claim 1, wherein the random signal is generated to have one of logic values '0' and '1' whenever the program data are inputted in a program operation.

3. The semiconductor memory device of claim 1, further comprising:
an I/O circuit and a column selection circuit configured to receive the program data and transfer the program data to the page buffer; and
a control circuit configured to generate control signals to enable the page buffer to perform the logical combination.

4. The semiconductor memory device of claim 1, wherein the page buffer comprises a plurality of latches configured to store the program data, data corresponding to the random signal, and the logically combined data.

5. The semiconductor memory device of claim 4, wherein the page buffer is configured to output read data in a read operation by logically combining the data corresponding to the random signal, and the program data stored in the memory cells.

6. The semiconductor memory device of claim 1, wherein the random signal generation circuit comprises a plurality of random signal generators each comprising:
a random circuit configured to generate and store the random signal in response to the program data; and
a random switch configured to transfer the program data and the random signal to the page buffer in response to a random enable signal.

7. The semiconductor memory device of claim 6, further comprising additional page buffers, wherein each page buffer is configured to store logically combined data in respective memory cell strings of the memory cell array.

8. A method of operating a semiconductor memory device, comprising a random circuit configured to generate a random signal and a page buffer comprising a plurality of latches coupled between a sense node and a common node, the method comprising:
inputting program data to a first latch of the latches;
storing the program data of the first latch in a second latch of the latches and storing inverse data of the program data of the first latch in a third latch of the latches;
storing an inverse signal of the random signal in the first latch; and
storing data, obtained by performing a logic operation on the program data and the random signal, in the third latch.

9. The method of claim 8, further comprising:
performing a program operation using data stored in the third latch.

10. The method of claim 8, wherein the storing of the data, obtained by performing the logic operation on the program data and the random signal, in the third latch comprises:
precharging the sense node and changing a potential of the sense node based on data stored in the first latch;
determining data stored in the third latch based on the potential of the sense node;
precharging the sense node and changing the potential of the sense node based on data stored in the first and second latches; and
determining the data stored in the third latch based on the potential of the sense node.

11. The method of claim 8, wherein the random signal is generated to have a logic value randomly selected from among logic values '0' and '1'.

12. The method of claim 10, wherein when precharging the sense node and changing the potential of the sense node based on the data stored in the first and second latches, if data '1' is stored in both the first and second latches, the potential of the sense node is maintained, and if data '0' is stored in at least one of the first and second latches, the potential of the sense node is changed to a logic value corresponding to data '0'.

13. The method of claim 8, wherein the logic operation includes an XOR operation.

14. A semiconductor memory device, comprising:
- a memory cell array comprising a plurality of memory cells;
- a random signal generator circuit configured to generate a random signal when a program operation and a read operation are performed;
- a page buffer having a first latch, a second latch and a third latch to store data during the program operation or the read operation; and
- a control circuit configured to program or read the memory cells using data obtained by logically combining the random signal and the data stored in the first, second and third latches.

15. The semiconductor memory device of claim 14, wherein when a program operation is performed, the control circuit controls the page buffer to store program data into the first and second latches, store inverse data of the program data into a third latch, logically combine data stored in the first, second and the third latches into the third latch, program the memory cells using the logically combined data.

16. The semiconductor memory device of claim 15, wherein the control circuit logically combines the data by precharging a sense node of the page buffer, changing a potential of the sense node based on data stored in the first latch, determining data stored in the third latch based on a potential of the sense node, precharging the sense node, changing a potential of the sense node based on data stored in the first and second latches, and determining data stored in the third latch based on the potential of the sense node.

17. The semiconductor memory device of claim 14, further comprising:
- an I/O circuit and a column selection circuit configured to receive the program data and transfer the program data to the page buffer.

18. The semiconductor memory device of claim 14, wherein the random signal generation circuit comprises a plurality of random signal generators each comprising:
- a random circuit configured to generate and store the random signal in response to the program data; and
- a random switch configured to transfer the program data and the random signal to the page buffer in response to a random enable signal.

* * * * *